(12) United States Patent
Kim

(10) Patent No.: US 7,388,240 B2
(45) Date of Patent: Jun. 17, 2008

(54) NON-VOLATILE MEMORY DEVICE CAPABLE OF PREVENTING DAMAGE BY PLASMA CHARGE

(75) Inventor: Tae Gyun Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 165 days.

(21) Appl. No.: 11/405,800

(22) Filed: Apr. 17, 2006

(65) Prior Publication Data
US 2006/0231869 A1    Oct. 19, 2006

(30) Foreign Application Priority Data
Apr. 18, 2005    (KR) .................... 10-2005-0032072

(51) Int. Cl.
*H01L 29/80* (2006.01)

(52) U.S. Cl. ................. 257/261; 257/758; 257/328; 257/E23.145

(58) Field of Classification Search ........... 257/261, 257/E23.145
See application file for complete search history.

(56) References Cited

U.S. PATENT DOCUMENTS

2005/0195636 A1* 9/2005 Umezawa et al. .......... 365/149

FOREIGN PATENT DOCUMENTS

| JP | 07-273198 A | 10/1995 |
| JP | 2004-335522 A | 11/2004 |
| KR | 10-2004-0048039 A | 6/2004 |
| KR | 10-2005-0055223 A | 6/2005 |

* cited by examiner

*Primary Examiner*—Tu-Tu V Ho
(74) *Attorney, Agent, or Firm*—Townsend and Townsend and Crew LLP

(57) ABSTRACT

A non-volatile memory device for preventing damage by plasma charges includes a gate electrode formed on a predetermined region of a semiconductor substrate, a source/drain region which is overlapped with the gate electrode and formed in a first well region of the semiconductor substrate, a first metal line coupled to the gate electrode through a first contact plug, a second metal line coupled to the first metal line through a second contact plug so that an external voltage is transferred to the gate electrode, a junction region formed in a second well region separated from the first well region, and a third metal line coupled to the junction region through a third contact plug and coupled to the second metal line through a fourth contact plug.

5 Claims, 1 Drawing Sheet

NON-VOLATILE MEMORY DEVICE CAPABLE OF PREVENTING DAMAGE BY PLASMA CHARGE

BACKGROUND

The present invention relates to semiconductor devices. More particularly, the present invention relates to non-volatile memory devices in which damage by plasma charges can be prevented.

In the manufacture process of non-volatile memory devices, a variety of processes employing a plasma phenomenon have been used. For example, the processes may include deposition of an insulation film or a metal film using plasma etch and plasma. Plasma is a light gas having electric charges. In the process using the plasma, there is a possibility that the destruction of the gate insulation film or degradation of the film quality may occur due to local charge irregularity.

Therefore, there is a need for non-volatile memory devices in which damage incurred by plasma charges can be prevented.

SUMMARY OF THE INVENTION

The present invention relates to non-volatile memory devices in which damage due to plasma charges can be prevented.

A non-volatile memory device according to an embodiment of the present invention includes a gate electrode formed on a predetermined region of a semiconductor substrate, a source/drain region which is overlapped with the gate electrode and formed in a first well region of the semiconductor substrate, a first metal line coupled to the gate electrode through a first contact plug, a second metal line coupled to the first metal line through a second contact plug so that an external voltage is transferred to the gate electrode, a junction region formed in a second well region separated from the first well region, and a third metal line coupled to the junction region through a third contact plug and coupled to the second metal line through a fourth contact plug.

The first contact plug may be formed on the same layer as that of the third contact plug.

The second contact plug may be formed on the same layer as that of the fourth contact plug.

The non-volatile memory device may further include a junction diode in which the second metal line, the second contact plug, the first metal line, the first contact plug, the third metal line, the fourth contact plug, the third contact plug, and the junction region are interconnected.

A non-volatile memory device according to another embodiment of the present invention includes a gate electrode formed on a predetermined region of a semiconductor substrate, a source/drain region which is overlapped with the gate electrode and formed in a first well region of the semiconductor substrate, a first metal line coupled to the gate electrode through a first contact plug, a second metal line coupled to the first metal line through a second contact plug so that an external voltage is transferred to the gate electrode, a triple well region separated from the first well region, and a third metal line coupled to the triple well region through a third contact plug and coupled to the second metal line through a fourth contact plug.

The first contact plug may be formed on the same layer as that of the third contact plug.

The second contact plug may be formed on the same layer as that of the fourth contact plug.

The non-volatile memory device may further include a junction diode in which the second metal line, the second contact plug, the first metal line, the first contact plug, the third metal line, the fourth contact plug, the third contact plug, and the triple well region are interconnected.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
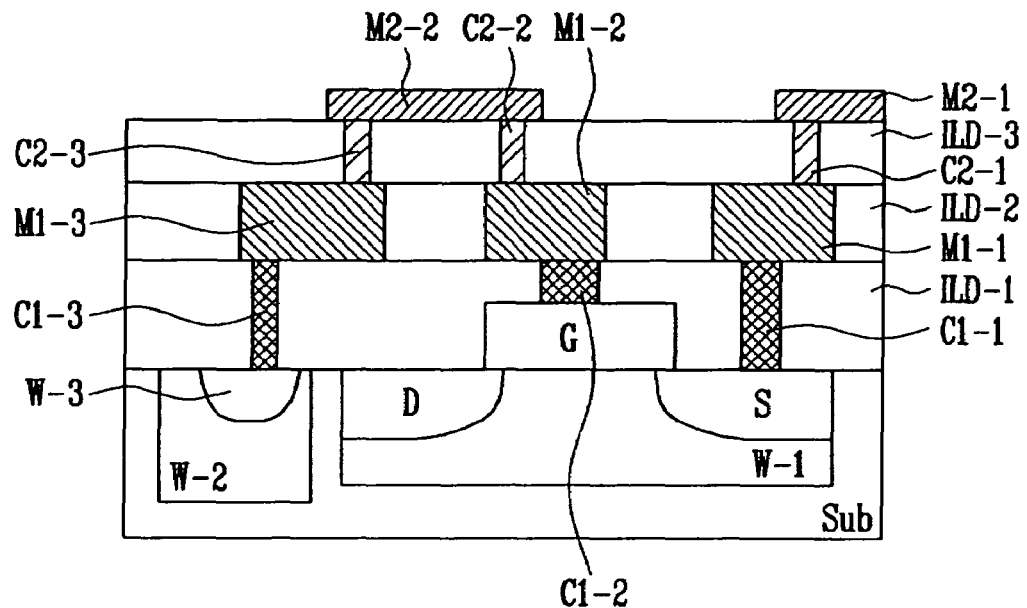
FIG. 1 is a cross-sectional view of a non-volatile memory device in which damage by plasma charges can be prevented according to an embodiment of the present invention.

In the following detailed description, only certain exemplary embodiments of the present invention have been shown and described simply by way of illustration. As those skilled in the art will realize, the described embodiments may be modified in various different ways, all without departing from the spirit or scope of the present invention. Accordingly, the drawings and description are to be regarded as illustrative in nature and not restrictive. Like reference numerals designate like elements throughout.

FIG. 1 is a cross-sectional view of a non-volatile memory device in which damage by plasma charges can be prevented according to an embodiment of the present invention.

Referring to FIG. 1, there is provided a semiconductor substrate (Sub) including a gate electrode (G) formed on a predetermined region and source/drain regions (S, D) which are overlapped with the gate electrode (G) and are formed in the semiconductor substrate (Sub). The source/drain regions (S, D) are formed within a well region (W-1) formed in a predetermined region of the semiconductor substrate.

A contact plug C1-2 that is coupled to a metal line M1-2 is formed on the gate electrode (G). A contact plug C1-1 that is coupled to a metal line M1-1 is formed in the source/drain regions (S, D). In one embodiment, metal line M1-1 is located on the same layer as that of metal line M1-2.

Metal line M1-2 is coupled to a metal line M2-2, which is coupled to external metal lines, through a contact plug C2-2 so that an external voltage can be transferred to the gate electrode (G). Metal line M1-1 is coupled to a metal line M2-1, which is located on the same layer as that of metal line M2-2, through a contact plug C2-1 so that the external voltage can be transferred to the source/drain regions (S, D).

Contact plug C1-2 and contact plug C1-1 are brought in contact with the gate electrode or the source/drain regions through an interlayer insulation film ILD-1 formed on the results including the gate electrode (G).

Metal line M1-2 and metal line M1-1 are brought in contact with contact plug C1-2 and contact plug C1-1 through an interlayer insulation film ILD-2 formed on the results including contact plug C1-2 and contact plug C1-1.

Furthermore, contact plug C2-2 and contact plug C2-1 are brought in contact with metal line M1-2 and metal line M1-1 through an interlayer insulation film ILD-3 formed on the results including metal line M1-2 and metal line M1-1.

In the embodiment described, a well region (W-2) is also formed in the semiconductor substrate (Sub) with this well region (W-2) being separated from well region (W-1). A junction region (W-3) is formed within well region (W-2).

A contact plug C1-3 is formed on the junction region (W-3). Contact plug C1-3 is coupled to a metal line M1-3 through the interlayer insulation film ILD-1 in which the contact plugs C1-1, C1-2 are formed.

A contact plug C2-3 is formed on metal line M1-3 through the interlayer insulation film ILD-3 in which the contact plugs C2-1 and C2-2 are formed in order to connect metal line M1-3 and metal line M2-2 to the external metal lines.

In the manufacture process of the semiconductor device as described above, electric charges are frequently generated in the plate region brought in contact with the contact plugs due to the plasma charge effect occurring in the etch process employing plasma.

A junction diode for dispersing the electric charges outside the semiconductor substrate is formed in the plate.

In other words, metal line M2-2, contact plug C2-2, metal line M1-2, contact plug C1-2, contact plug C2-3, metal line M1-3, contact plug C1-3, and junction region (W-3) are interconnected to form the junction diode. Accordingly, the plasma charges generated in the plasma process can be dispersed to the junction region (W-3) due to the junction diode. It is thus possible to prevent damage due to plasma charges of the semiconductor device.

Figure 2:
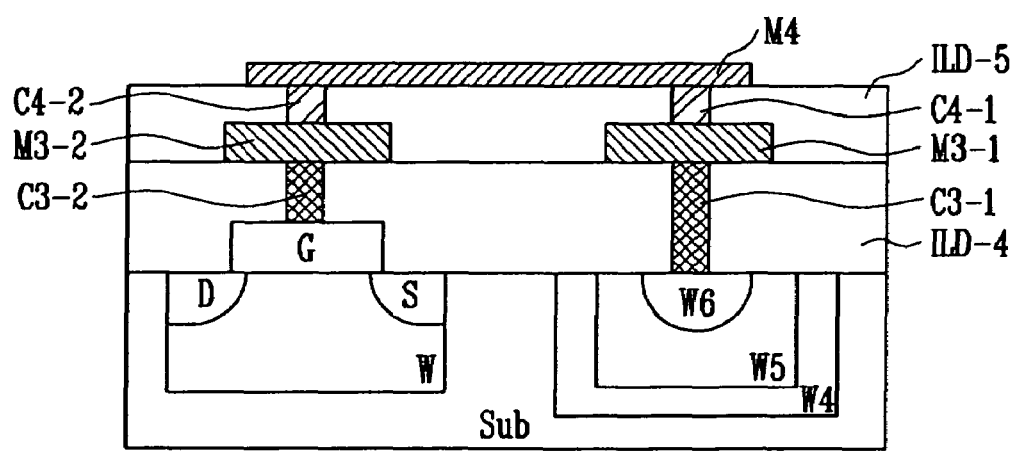
FIG. 2 is a cross-sectional view of a non-volatile memory device in which damage by plasma charges can be prevented according to another embodiment of the present invention.

FIG. 2 is a cross-sectional view of a non-volatile memory device according to another embodiment of the present invention.

Referring to FIG. 2, there is provided a semiconductor substrate (Sub) including a gate electrode (G) formed on a predetermined region of the semiconductor substrate (Sub) and source/drain regions (S, D) which are overlapped with the gate electrode (G) and are formed in the semiconductor substrate (Sub). The source/drain regions (S, D) are formed within a well region (W) formed in a predetermined region of the semiconductor substrate.

A contact plug C3-2 for exposing the gate electrode, which is coupled to a metal line M3-2, is formed on the gate electrode (G). A contact plug C4-2 for exposing the metal line, which is coupled to a metal line M4 coupled to external metal lines, is formed on metal line M3-2.

The contact plug C3-2 is brought in contact with the gate electrode (G) through an interlayer insulation film ILD-4 formed on the results including the gate electrode (G).

The contact plug C4-2 for exposing the metal line is brought in contact with metal line M3-2 through an interlayer insulation film ILD-5 formed on the results including metal line M3-2.

In the above-mentioned structure, another well region is formed in the semiconductor substrate (Sub) with this well region being separated from well region (W). In one embodiment, the well region may include triple well regions (W6, W5 and W4).

The triple well regions (W6, W5 and W4) are coupled with a contact plug C3-1, which is brought in contact with a metal line M3-1 through interlayer insulation film ILD-4.

A contact plug C4-1 penetrates interlayer insulation film ILD-5 formed on the results including metal line M3-2 in order to connect metal line M3-1 and metal line M4 to the external metal lines.

A junction diode for dispersing electric charges outside the semiconductor substrate is formed in the plate.

In other words, metal line M4, contact plug C4-2, metal line M3-2, contact plug C3-2, contact plug C4-1, metal line M3-1, contact plug C3-1, and triple well regions (W6, W5 and W4) are interconnected to form the junction diode.

Accordingly, the plasma charges generated in the plasma process can be dispersed to the triple well regions (W6, W5 and W4) due to the junction diode. It is thus possible to prevent damage due to plasma charges of the semiconductor device.

The transistor shown in FIG. 1 is a a transistor having a positive threshold voltage (Vt), whereas the transistor shown in FIG. 2 is a transistor having a negative threshold voltage (Vt).

The transistor having the negative threshold voltage (FIG. 2) is a transistor into which ions are not implanted in order to form a well. Accordingly, the transistor is used to transfer a signal on the circuit because the threshold voltage itself a negative value. In measuring the negative threshold voltage of the transistor, however, the voltage of the gate electrode becomes negative. Therefore, a forward current is formed since a negative bias is applied to the N junction as shown in FIG. 2. In this case, if the junction of FIG. 2 is formed to have a triple well structure, plasma charges may be dispersed.

As described above, in accordance with embodiments of the present invention, a junction diode for dispersing electric charges outside the semiconductor substrate is formed in the plate. Accordingly, damage by plasma charges of the semiconductor device can be prevented.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A non-volatile memory device comprising:
   a gate electrode formed on a predetermined region of a semiconductor substrate;
   a source/drain region provided adjacent to the gate electrode and formed in a first well region of the semiconductor substrate;
   a first metal line coupled to the gate electrode through a first contact plug;
   a second metal line coupled to the first metal line through a second contact plug so that an external voltage is transferred to the gate electrode;
   a triple well region of the semiconductor substrate, the triple well region being separated from the first well region; and
   a third metal line coupled to the triple well region through a third contact plug and coupled to the second metal line through a fourth contact plug.

2. The non-volatile memory device as claimed in claim 1, wherein the first contact plug is formed on the same layer as that of the third contact plug.

3. The non-volatile memory device as claimed in claim 1, wherein the second contact plug is formed on the same layer as that of the fourth contact plug.

4. The non-volatile memory device as claimed in claim 1, further comprising a junction diode in which the second metal line, the second contact plug, the first metal line, the first contact plug, the fourth contact plug, the third metal line, the third contact plug, and the triple well region are interconnected.

5. The non-volatile memory device as claimed in claim 1, wherein the device has a negative threshold voltage (Vt).

* * * * *